United States Patent
Rumiantsev et al.

(10) Patent No.: US 7,768,271 B2
(45) Date of Patent: Aug. 3, 2010

(54) METHOD FOR CALIBRATION OF A VECTORIAL NETWORK ANALYZER HAVING MORE THAN TWO PORTS

(75) Inventors: Andrej Rumiantsev, Dresden (DE); Steffen Schott, Dresden (DE); Stojan Kanev, Sacka (DE)

(73) Assignee: SUSS Microtec Test Systems GmbH, Sacka (DE)

( * ) Notice: Subject to any disclaimer, the term of this patent is extended or adjusted under 35 U.S.C. 154(b) by 312 days.

(21) Appl. No.: 11/942,095

(22) Filed: Nov. 19, 2007

(65) Prior Publication Data
US 2008/0122451 A1    May 29, 2008

(30) Foreign Application Priority Data
Nov. 27, 2006    (DE) ................. 10 2006 056 192

(51) Int. Cl.
*G01R 35/00*    (2006.01)
(52) U.S. Cl. ..................... 324/601; 324/650
(58) Field of Classification Search ............. 324/601, 324/650
See application file for complete search history.

(56) References Cited

U.S. PATENT DOCUMENTS

| 7,130,756 | B2 | 10/2006 | Heuermann | |
| 2004/0246004 | A1* | 12/2004 | Heuermann | ................. 324/601 |

* cited by examiner

*Primary Examiner*—Vincent Q Nguyen
(74) *Attorney, Agent, or Firm*—Heslin Rothenberg Farley & Mesiti P.C.

(57) ABSTRACT

Method for calibrating a vectorial network analyzer, with n measurement ports (n>2) and at least m measurement sites, where m>n+1 includes measurement of three different n-port reflection standards, connected between measurement ports in any desired order, and successive measurement of reflection and transmission parameters at different transmission standards, connected between two respective measurement ports, and computational determination of error coefficients and error-corrected scattering matrices [$S_x$] of the n-port standards. Reflection standards, Short and Open, are unknown, but physically identical at each n-fold one-port. Reflection standard, realized by wave terminations, is known, but can be different at each n-fold one-port. Transmission standards are measured at a transmission standard, having known length and attenuation at a two-port, and at unknown transmission standards, identical for incident and reflected waves at remaining two-ports, which can be connected. Unknown reflection and transmission values are determined computationally by the measurements.

8 Claims, 2 Drawing Sheets

Figure 1A:
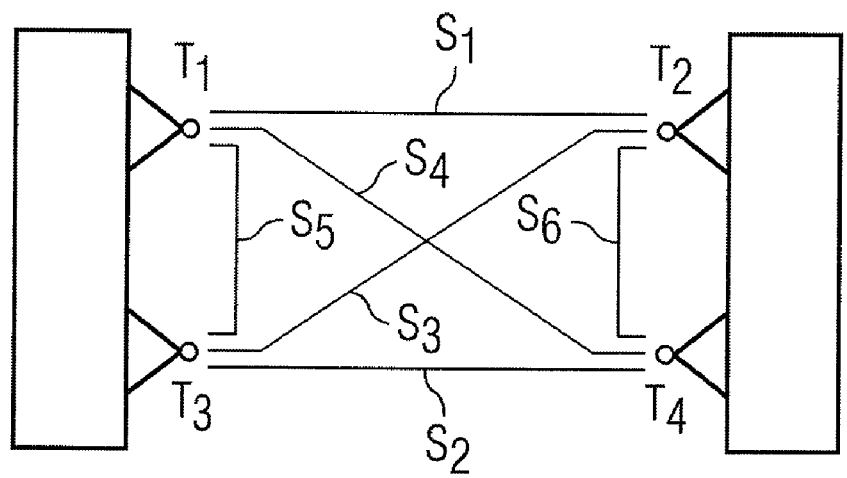

METHOD FOR CALIBRATION OF A VECTORIAL NETWORK ANALYZER HAVING MORE THAN TWO PORTS

CROSS REFERENCE TO RELATED APPLICATIONS

This application claims priority of German Application No. 10 2006 056 192.9 filed on Nov. 27, 2006, which application is hereby incorporated by reference herein, in its entirety.

BACKGROUND ART

The invention relates to a method for calibrating a vectorial network analyzer, which exhibits n measurement ports (n>2) and at least m measurement sites, where m>n+1, by means of three different n-port calibration standards, which are connected between the measurement ports in any desired order and which are not permitted to show any transmission, and by successive measurement of the reflection and transmission parameters at different two-port calibration standards, which are connected between the measurement ports in a defined combination and any desired order and must all have a transmission path. By using the measured two-port calibration standards as well as by computational determination of the error-corrected scattering matrices $[S_x]$ of the n-port calibration standards from the error coefficients of each two-port calibration standard, the error coefficients of the network analyzer are computationally determined with the 10-term method in k-fold application, taking into consideration the transmission error variables of the remaining n−2 measurement ports.

Vectorial network analyzers (VNAs) are used for precise measurement of electronic devices and components as well as active and passive high frequency circuits and high frequency modules up to and including antennas.

The customary descriptive model of the electrical behavior of electronic modules and components in high frequency engineering is effected by means of their scattering parameters (also S parameters). They link wave variables with one another, rather than currents and voltages. This representation is particularly adapted to the physical conditions. The so-called scattering parameters of n-ports (n=1, 2, . . . ) are detected and, if necessary, are converted into 2n pole parameters (for example, Z or Y parameters).

The following relationship applies, for example, to the waves $a_1$ and $a_2$, which travel up to a two-port, and the waves $b_1$ and $b_2$, which propagate correspondingly in the opposite direction:

$$\begin{pmatrix} b_1 \\ b_2 \end{pmatrix} = \underbrace{\begin{pmatrix} S_{11} & S_{12} \\ S_{21} & S_{22} \end{pmatrix}}_{=[S]} \begin{pmatrix} a_1 \\ a_2 \end{pmatrix},$$

where [S] is the scattering matrix, which identifies the electronic properties of the two-port.

A so-called system error correction provides for the actual possibility of carrying out precise measurements of the scattering parameters of modules and components using vectorial network analyzers. This system error correction assumes the precise measurement of standards, the electronic behavior of which is known or which can be determined during the system error correction.

It is well known that in the so-called calibration operation, the reflection and/or transmission behavior of calibration standards, which are unknown or partly or completely known, is measured during the system error correction at several measurement sites, which are to be optimized in terms of position and number.

From the measured values of the calibration standards, correction data (so-called error variables or coefficients) are obtained by means of special computation methods. With these correction data and a corresponding correction calculation, measured values, from which system errors of the vectorial network analyzer and of the leads, for example, couplings (cross-talk) or mismatches (reflections) have been eliminated, are obtained for any desired measurement object.

One known calibration method for a two-port model with 10 or 12 error variables is the so-called 10-term or 12-term method. It is also referred to as SOLT (S: Short, O: Open, L: Load=Match, T: Thru) in the American literature and as TMSO in Europe. It is the only system calibration method for two-port network analyzers with just three measurement sites. That is, each measurement site is located at the common measurement channel for both ports before the switch which switches each time one of the ports for measurement, and an additional measurement site at the measurement channel of each port. In this arrangement of the n+1 measurement sites, where n is the number of ports, the switch is integrated in the measurement of the calibration standards.

In the case of this TMSO calibration method, which is used the most often in practice, it is necessary for the two measurement ports to be connected first, which corresponds to the calibration standard T (T=Thru), in order to determine the correction data. Therefore, three one-ports—for example, the calibration standards wave sink (M=Match), short circuit (S=Short) and open circuit (O=Open)—have to be contact-connected and measured at each measurement port. In order to obtain the necessary number of terms for determining the error coefficients from these measurements of the four different calibration standards, it is necessary to know the electronic behavior of all four standards—that is, their transmission and/or reflection behavior. Whereas the calibration standard T exhibits one transmission path (transmission standard) and is realized by means of a direct connection of two measurement ports or one short adapted line, the calibration standards M, S and O do not exhibit any transmission path (reflection standards). The reflection standards are realized by means of impedances—for example, so-called wave terminations with 50Ω (M)—or by means of highly reflecting terminations (O and S).

In modern devices, the measurement accuracy of vectorial network analyzers is influenced almost exclusively by the possibility of realizing the calibration standards required for the system error correction, because the device-internal evaluation of the measurement with the network analyzer assumes that the calibration standards always have ideal values. However, the physically realizable calibration standards are not ideal. It is only possible to realize standards whose electronic properties resemble the ideal standards—for example, open circuit or short circuit. For example, the amount of the reflection factor during a short circuit is always less than one owing to the losses; or the broadband termination shows a significant deviation from the reflection zero especially in the upper frequency range.

The multiport measurement problem lies in the fact that all measurement ports are linked together via the object to be measured. This means that it is no longer the case that a measure of the incident wave is obtained at one measurement site, a measure of the reflected wave is obtained at the next measurement site, and a measure of the transmitted wave is finally obtained at an additional measurement site, independently of the terminations of the multiport. Rather, it is also necessary to take into account the reflection properties of the other measurement ports in the model.

In recent years a number of solutions have been published and patented for this multiport measurement problem. The Ferrero solution to the multiport measurement problem, described by Ferrero, Pisani, Kerwin in "A New Implementation of a Multiport Automatic Network Analyzer", IEEE Trans. Microwave Theory Techn., vol. 40, November 1992, pp. 2078-2085, requires a network analyzer with 2n measurement sites with the same outlay of calibration standards as the TMSO method. Accordingly, the demands on the hardware of the calibration standards are very complex. Similarly all of the calibration standards have to be completely known in Ferrero's method. This feature is especially disadvantageous since the known standards cannot be perfectly realized. Furthermore, the Ferrero method is based exclusively on the 7-term principle.

As a result there are significant measurement errors, since the known standards have not been perfectly realized and the 7-term principle is sensitive to such model errors, as described by Heuermann in "Sichere Verfahren zur Kalibrierung von Netzwerkanalysatoren für koaxiale und planare Leitungssysteme" [Reliable Methods for Calibrating Network Analyzers for Coaxial and Planar Line Systems], dissertation, Department of High Frequency Engineering, Ruhr University Bochum, 1995, ISBN 3-8265-1495-5.

The DE 199 18 697 A1 describes a 10-term method, which, like the TMSO method, requires just n+1 measurement sites, but only known calibration standards.

Thus, the multiport 7-term methods, which are described in the DE 199 18 960 A1 and are based on an adaptation of the known two-port methods to a multiport method, comprise the TAN, TNA, LAN, TRL, TLR, LLR, LRL, TAR, TMR, TRM, TMS, LMS, TMO, LMO, UMSO, TMN, LNN, TZU, TZY, TYU, LZY, ZZU, YYU, QSOLT methods and usually require n−1+2 calibration measurements.

Another method from the company ATN is described in the U.S. Pat. No. 5,578,932. This patent describes in detail a so-called test set, which can be used to expand a two-port network analyzer to n ports. Furthermore, a special calibration device is described that is required for the automatic calibration of this test set.

This calibration device contains, in addition to the standards open, short and match (also termination), an arrangement of various transmission lines, which can be connected between the terminals of the calibration device via semiconductor switches. Consequently, as in the TMSO method, all of the standards must be completely known. At variance with the statement in the abstract, however, complete multiport calibration and error correction do not occur. Instead, only two-port paths are calibrated; the remaining ports are not taken into account (column 18, line 57).

Two-port measurements are carried out in succession during subsequent measurement operations. In this case the measurement ports, which are not included in the calibration, are terminated one after the other by different reflection standards, which are incorporated within the test set. Precisely one two-port measurement is carried out for each value of the reflection standard (column 21, line 1). Once the measurements have been performed at all of the measurement ports, a result, which has been corrected with respect to the systematic errors, can be calculated from the resulting measured values and the known values of the reflection standards. According to the patent, the measurement of a three-port test object requires two two-port measurements from port 1 to port 2 and from port 1 to port 3 (column 21, line 1 and line 45). In this case, for a complete characterization of all of the parameters, it is necessary to terminate the third port of the test object that was not included in the measurement from port 1 to port 2, by means of at least three different reflection standards (column 21, line 28). This means that the complete characterization of a three-port requires 3+1=4 two-port measurements.

The DE 10 2004 020 037 A1 describes a so-called RRMT calibration method, where, in contrast to the aforementioned methods, not all of the calibration standards have to be known. In a first step the scattering parameters of the unknown calibration standards—Open and Short—are computationally determined from the measurement of the transmission and reflection behavior of the transmission standards, which are known in terms of length and attenuation; the reflection behavior of n known impedances, which are realized at the one-ports, but may be different in comparison to each other, and the n unknown, highly reflecting standards—Open and Short—, in order to determine the error coefficients of the network analyzer with the 10 known terms.

However, the problem in this case is that the measurement of electronic components in the wafer composite (on-wafer measurements) is subject to certain boundary conditions—especially with regard to the possibility of realizing the calibration standards.

In the semiconductor field, it is not unusual for users to realize the calibration standards on the wafers themselves. The geometrical repeatability and uniformity of such self-made calibration standards is very high. In this case it is advantageous that the calibration standards are located on the same substrate carrier (semiconductor) as the measurement objects. In addition to the advantages of short travel distances, it is also possible to "calibrate out" parasitic elements as well as transition effects from the measuring tip to the wafer. However, the electronic properties are realized only to a good approximation. In particular, the reflection standard—Open Circuit—cannot be produced with the necessary quality.

The reflection standards (R) can be described very precisely on semiconductors, but, as a rule, vary widely with regard to the direct current resistance values. In the described methods according to the prior art, it is necessary to connect R standards with the reflection behavior, which is as identical as possible, to each measurement port. If this cannot be ensured, as is the case in multiport on-wafer measurements, since standards have to be routinely arranged at an angle of 90 deg. with respect to one another, then the results are so-called strains that are usually the source of very large measurement errors.

Moreover, the realization of known transmission standards on the wafer is especially problematic. They generally exhibit relatively large deviations from the ideal value. Owing to the arrangement of the ports on the wafer in rows or opposite one another, as shown schematically in FIGS. 1a and 1b with the four ports $T_1$ to $T_4$ and the four transmission standards $S_1$ to $S_6$, and owing to the connection of respectively two of the ports by means of one transmission standard, angles or bends in these standards usually cannot be avoided. For this reason such "bent" transmission standards $S_3$ to $S_6$ always exhibit losses and resonances.

However, such error sources also occur in the production of transmission standards by means of coaxial cables, in so far as, for example, reflecting components, like adapters, are incorporated.

SUMMARY OF THE INVENTION

Therefore, the invention is based on the problem of providing a method for calibrating network analyzers, which exhibit n measurement ports and more than n+1 measurement sites and are also used to measure multiports on semiconductor wafers. By using transmission standards, which are not completely known and produced by the user, it is possible to perform a largely repeatable calibration with enhanced measurement accuracy.

The described methods are characterized in that, in addition to the two reflection standards—Open and Short—, the transmission standard of each combination of measurement ports does not have to be known exactly. Consequently, the multiport measurements can be carried out with high precision and at very low costs for the calibration standards with these methods and with calibration standards that are produced by the users themselves. All of the described methods are characterized by the following uniqueness criteria of the calibration standards:

1.: The phase of each reflection standard—Open and Short—has to be known only to ±90 deg. More information is not required. In practice, a real short circuit and an open circuit are used; each one is realized so as to be physically identical at each n-fold one-port. The divergences from an ideal short circuit or open circuit have no influence on the measurement accuracy.

2.: The impedance standards (M) have to be completely known. However, in contrast to the standards—Open and Short—, they can be different from each other, in comparison. Such standards are often also referred to as transfer match.

3.: One of the transmission standards (T), which are realized between the measurement ports in the combinations to be produced according to the respective method, has to be completely known, but may have a finite attenuation and, if desired, a known reflection behavior. The remaining transmission standards, which are realized as a connection between each pair of measurement ports, may exhibit a finite attenuation and a reflection behavior, which do not have to be known, but have to be identical (reciprocal transmission standard) for the incident and reflected wave. These unknown transmission standards between the different measurement ports may also be different from each other.

Ideally the known transmission standard is a linear connection between two ports, since no unknown losses or resonances may occur at bends.

Compared to the prior art, the accuracy of the measurement is significantly increased, because the error sources in the calibration measurement of the error-prone transmission standards are avoided. In addition, the impedance standards are measured at the n-one-port. Hence, deviations, compared to the measured reference port, are avoided at the so-called matching point ($S_{11}=0$), where the properties of the M standard at the other measurement ports are "over-calculated." Moreover, the normal and inevitable fluctuations in known direct current resistance values of the impedance standards on semiconductors do not influence the methods of this invention. The additional measurements that are required for determining the unknown scattering parameters do not constitute a drawback in the case of on-wafer measurements, since they run fully automatically to a considerable extent and their costs are only a small fraction of the cost of the whole system. Moreover, these measurements provide additional information for raising the quality of the calibration method.

In addition, the method, according to claim 1, and the method, according to claim 3, are characterized in that that they always use lines for the connections of the measurement ports. This feature satisfies the special conditions for on-wafer measurements, where, in contrast to coaxial measurements, the measurement ports (on-wafer measuring tips or probes) cannot be directly connected. Therefore, it is never possible to use a genuine thru standard.

The reflection standards—Open and Short—are especially suitable for realizing physically identical calibration standards at the individual ports, thus obtaining the terms, which are required due to the unknown thru connections and are used for determining the scattering parameters even from this boundary condition of the method. Therefore, it is possible to infer from the measurement of one of the reflection standards the electronic properties of the physically identical standards at the other port.

Comparable advantages are achieved if the transmission standards are symmetrical to each other. Referring to FIG. 1a, for example, the standards $S_5$ and $S_6$ and in FIG. 1b the standards $S_4$ and $S_5$ are structured so as to be symmetrical to each other. With the aid of the information, to be obtained in this manner, it is possible, for example, to produce a smaller number of transmission standards—the n−1 standards between a reference port and the other ports—a feature that in the aforementioned cases is advantageous on the wafer level.

In connection with the use of more than n+1 measurement sites, the described methods operate significantly more precisely and with greater long-term stability than the known methods. Even when 2n measurement sites are used, the drift effects of the electronic changeover switches have no influence on the measurement quality. The number of measurement sites can also be greatly reduced as a function of the known and unknown calibration standards, according to the method being used, and the demands on the quality of the measurements. For example, instead of two, only one measurement site is arranged at selected measurement lines; or the switch for individual calibration measurements is also included, as known from the network analyzers with n+1 measurement sites.

The distinction between the methods according to claim 1, and the methods derived therefrom and the methods according to claim 3, and the methods derived therefrom lies in the number of measurements of the transmission standards. The methods according to claim 1 require such a number of measurements that is the product of all possible combinations of two ports for realizing a transmission standard and, thus, more than in the methods, according to claim 3, where only n−1 measurements are necessary, because the transmission standard is measured only between a reference port and the remaining n−1 ports, instead of between all combinations of the measurement ports. The methods according to claim 1 are distinguished in turn by a greater robustness. Thus, it can be shown, for example, that the transmission measurement dynamic range for the methods according to claim 1 corresponds to that of the device. These methods are used when a measurement of the dynamic range of the network analyzer has to be achieved. In contrast, the methods according to claim 3 exhibit a significantly greater sensitivity to small contact-connection errors and incompletenesses in the calibration standards because of the use of the 7-term method for the computational determination of the error coefficients and the scattering matrix. Consequently the methods according to claim 3 are used only if the number n of the measurement ports is disproportionately large. The increased sensitivity of the 7-term method to the model errors has only a slight influence, since the measurement of the impedance is carried out at the n-one-port so that an "over-calculating" is not necessary and since it constitutes an optimization of the computational complexity for these multiports.

With such low demands on the calibration standards, the described multiport calibration methods can also be used, in particular, for automated calibrations of vectorial network analyzers in coaxial environments.

BRIEF DESCRIPTION OF THE DRAWING FIGURES

Figure 1B:
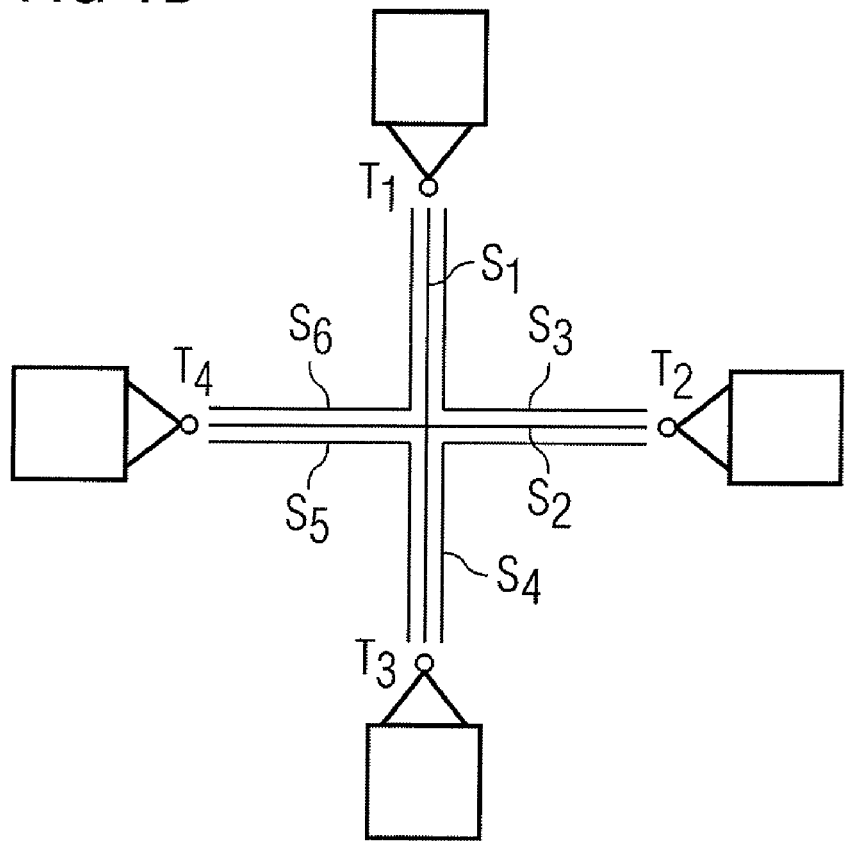
Figure 2:
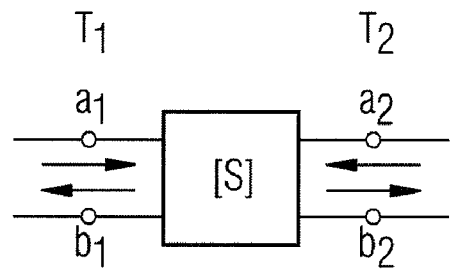
Figure 3:
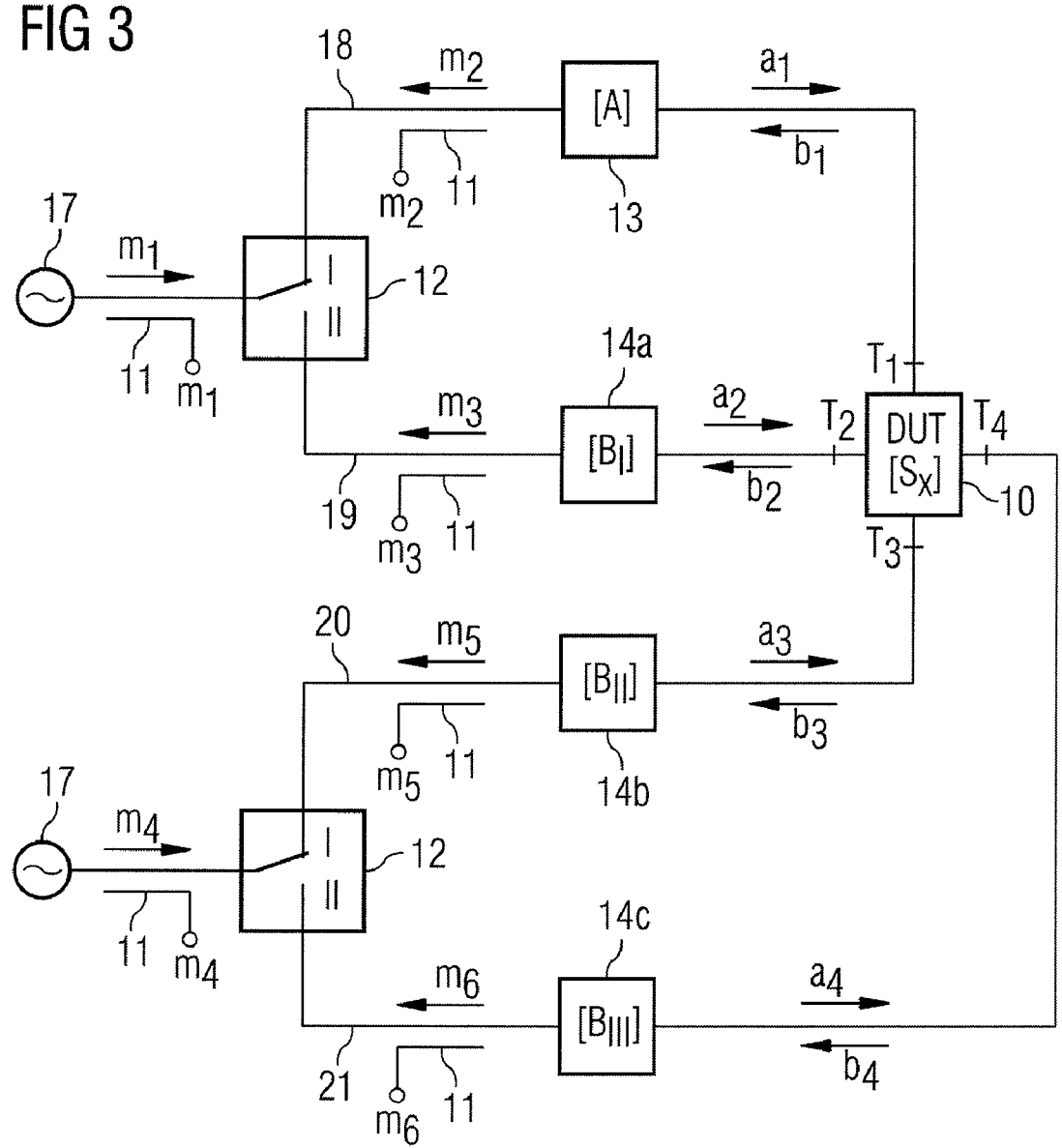

In the associated drawings FIGS. 1a and 1b are schematic representations of six transmission standards, which are realized in different ways on a wafer, for each four-port, FIG. 2 is a schematic definition of a scattering matrix with incident and reflected waves at the two-port, and FIG. 3 is a block diagram of a vectorial four-port network analyzer with six measurement sites.

FIG. 2 depicts a two-port, which is characterized by its scattering matrix [S]. The waves $a_1$ and $a_2$ are the waves traveling to the two-port; and $b_1$ and $b_2$ are correspondingly the waves propagating in the opposite direction. The following relationship holds true:

$$\begin{pmatrix} b_1 \\ b_2 \end{pmatrix} = \underbrace{\begin{pmatrix} S_{11} & S_{12} \\ S_{21} & S_{22} \end{pmatrix}}_{=[S]} \begin{pmatrix} a_1 \\ a_2 \end{pmatrix}.$$

An n-port with the waves $a_1$ to $a_n$, $b_1$ to $b_n$ and the characterizing scattering matrix [S] must be shown in an analogous manner. The case of a four-port network analysis system—that is, n=4—is illustrated as a block diagram in FIG. 3. It can be seen that n+2=6 measurement sites 11 are necessary. FIG. 3 demonstrates how such a construction is to be realized and serves as a basis for the following description of the multiport methods.

DETAIL DESCRIPTION

FIG. 3 illustrates how the signal from one of two sources 17 is conducted via a first changeover switch 12 onto the branches 18 and 19; and the signal from a second source 17 is conducted via a second changeover switch 12 onto the branches 20 and 21. Both changeover switches 12 are arranged in front of the measurement sites 11 for the waves reflected into the respective branches 18, 19, 20, and 21 (referred to here as $m_2$ and $m_3$ as well as $m_5$ and $m_6$). Two additional measurement sites 11 (referred to as $m_1$ and $m_4$), which make a measure of the incident waves, are arranged between a respective source 17 and a switch.

Thus, the measurement sites 11, assumed to be ideal, are viewed in the propagation direction of the wave to be measured, are always arranged in front of a switch 12, and in each case make a measurement of the incident and transmitted wave. The properties of the switches 12—such as repeatability, reflection and long-term stability—are taken into account in the following computation using the 10-term model. All deterministic non-idealities and incompletenesses in the form of mismatches and cross-talk are combined and taken into account in the error matrices 13, 14a, 14b and 14c. At the ports $T_1$, $T_2$, $T_3$ and $T_4$ the measurement object 10 (DUT) is connected to the vectorial network analyzer by means of the appropriate switch position.

The measurement values $m_n$ for the reflection behavior or the transmission behavior of realized calibration standards are measured in each switch position at the respective two measurement sites. For the method according to claim 1, there are the one transmission standard of known length and attenuation—for example, between the ports $T_1$ and $T_2$—as well as five other unknown transmission standards, which are connected between the ports $T_3$ and $T_1$, $T_4$ and $T_1$, $T_3$ and $T_2$, $T_2$ and $T_4$ as well as $T_3$ and $T_4$. In addition, the respective n-fold match standards as well as the reflection standards, which are similar to short and open circuits, all being measured at each one-port, are referred to as n-one-port. In so far as one of the other methods is used, the measurement values $m_n$ are measured according to the features described to this end. The scattering matrix is determined from these measurement values, as described below.

The described methods can be subdivided into three steps from a mathematical standpoint:

1. the so-called self-calibration of the unknown reflection and transmission standards;

2. the so-called direct calibration; and 3. the system error correction.

In the first step the unknown parameters of the calibration standards are calculated. To this end, the trace and determinant properties of mapping matrices are utilized, as described by Heuermann in "Sichere Verfahren zur Kalibrierung von Netzwerkanalysatoren für koaxiale und planare Leitungssysteme" [Reliable Methods for the Calibration of Network Analyzers for Coaxial and Planar Line Systems], dissertation, Department of High Frequency Engineering, Ruhr University Bochum, 1995, ISBN 3-8265-1495-5. In this case the match calibration standards are not taken into account with the ideal properties (S 11=0) in mathematics. This feature has the effect that the resultant equations for calculating the reflection values of the two R standards are significantly longer. However, these equations do not differ from the customary solutions of self-calibration calculations with regard to the aforementioned uniqueness criteria for the line, impedance and reflection standards.

In the second step of direct calibration, the error coefficients are calculated. This is done for the RRMT method according to claim 1, and for the LRRM method according to claim 3, by means of the classical approaches of the 10-term methods, as described by Schick in "Messsysteme der Hochfrequenztechnik" [Measurement Systems of High Frequency Engineering], Hüthig-Verlag, Heidelberg, 1984, and by Heuermann in "Sichere Verfahren zur Kalibrierung von Netzwerkanalysatoren für koaxiale und planare Leitungssysteme" [Reliable Methods for the Calibration of Network Analyzers for Coaxial and Planar Line Systems], dissertation, Department of High Frequency Engineering, Ruhr University Bochum, 1995, ISBN 3-8265-1495-5. A two-port calibration is carried out for each transmission path; and the error coefficients are known for this connection. Then the procedure for treating the multiport method is described as the third step.

For the methods according to claim 3, the procedures of the 7-term methods for calculating the error coefficients are also described by Heuermann in "Sichere Verfahren zur Kalibrierung von Netzwerkanalysatoren für koaxiale und planare Leitungssysteme" [Reliable Methods for the Calibration of Network Analyzers for Coaxial and Planar Line Systems], dissertation, Department of High Frequency Engineering, Ruhr University Bochum, 1995, ISBN 3-8265-1495-5, for similar two-port methods.

The conjoining of these results of the two-port methods to form a multiport method is also presented in the next step.

In the third step for carrying out a system error correction, the measurement data of an unknown measurement object are corrected by the errors of the vectorial network analyzer and the leads.

For the methods according to claim 1, which are based on the 10-term principle, the initial basis for the mathematical description of the 10-term multiport methods (also often referred to as the multiport methods) forms the above described error model. For the sake of simplicity, the mathematical derivation shall be carried out here only for the case of the measurement of three-ports. A source signal is conducted onto the branch of the respective port by means of a suitable switch position I, II and III. This procedure can be generalized to n-ports in a simple manner.

In order to determine the classical error matrices of the 10-term model, a two-port calibration is carried out between each of the three possible combinations of measurement ports with the respective error matrices [A], [F], and [G]. The following holds true: $[F]=[B_I]^{-1}$ and $[G]=[B_{II}]^-$.

For a first switch position I, the error matrix [A] is the reference port, which contain three error variables. For II it is [F], and for III it is [G]. The two other measurement ports for each switch position contain only the two error variables (for example, $F_T, F_L$) of the transmission error network. The associated variables are to be subsequently deleted once, twice and three times, as a function of the switch position. Consequently the results are 3*3+3*2*2=21 error variables for the three-port case.

The correction calculation of the measured values of the measurement object (mi) using the 21 error variables can be formulated as follows:

$$\begin{pmatrix} m'_2 \\ a'_1 \end{pmatrix} = [A'] * \begin{pmatrix} m'_1 \\ b'_1 \end{pmatrix}, b'_2 = m'_4 = m'_4/F'_T, \quad (2)$$

$$a'_2 = F'_1 * b'_2, b'_3 = m'_6/G'_T, a'_3 = G'_T * b'_3. \quad (3)$$

A transformation yields six equations for the six wave variables $a'_1, a'_2, a'_3, b'_1, b'_2, b'_3$.

The procedure is exactly the same for the remaining switch positions. These 3*6 equations can be used in the equation:

$$\begin{pmatrix} b_1 \\ b_2 \\ b_3 \end{pmatrix} = [Sx] \begin{pmatrix} a_1 \\ a_2 \\ a_3 \end{pmatrix} \quad (4)$$

In this case, the values of a matrix column are obtained for each switch position. The result is ultimately a system of linear equations, comprising two n*n measured value matrices and the n*n scattering matrix. If this system of equations is resolved for the $[S_x]$ matrix, then the error-corrected scattering parameters of an n-port are available.

For the methods according to claim 3, which are based on the 7-term principle, the initial basis for the mathematical description of the 7-term multiport methods (also often referred to as the multiport method) also forms the same model. For the sake of simplicity, the mathematical derivation shall be carried out here only for the case of the measurement of three-ports. This procedure can be generalized in turn to n-ports in a simple manner by providing a changeover switch with n output ports and taking into account additional measurement sites for each additional port of the measurement object.

In order to determine the classical error matrices of the 7-term model, a two-port calibration is carried out between the reference port with the error matrix [A] and the error matrices $[B_i]$ (i=1, 2, ..., n).

The designation 7-term model is derived from the fact that the associated 2*2 error matrices [A] and $[B_i]$ contain a total of seven error terms, since one of the eight variables contained therein can always be set to 1.

Furthermore, it is advantageous to formulate the mathematical formula of the two-port model in the inverse format of the given transmission parameters:

$$[G]=[A]^{-1}, [H_i]=[B_i]^{-1}, i=1,2 \quad (2)$$

where the following holds true for the inputs and outputs at the error networks:

$$\begin{pmatrix} b_1 \\ a_1 \end{pmatrix} = [G] * \begin{pmatrix} m_1 \\ m_2 \end{pmatrix}, \begin{pmatrix} a_i \\ b_i \end{pmatrix} = [H_i] * \begin{pmatrix} m_{2i-1} \\ m_{2i} \end{pmatrix} \quad (3)$$

These equations can be resolved for $a_i$ and $b_i$ wave variables and used in the equation:

$$\begin{pmatrix} b_1 \\ b_2 \\ b_3 \end{pmatrix} = [Sx] \begin{pmatrix} a_1 \\ a_2 \\ a_3 \end{pmatrix} \quad (4)$$

In this case, the values of a matrix column are obtained for each switch position, a procedure that ultimately leads to a system of linear equations, comprising two n*n measured value matrices and the n*n scattering matrix. If this system of equations is resolved for the $[S_x]$ matrix, then the error-corrected scattering parameters of an n-port are available.

The invention claimed is:

1. Method for calibrating a vectorial network analyzer, which exhibits n measurement ports (n>2) and at least m measurement sites, where m>n+1, by measurements of three different n-port calibration standards, which are connected between the measurement ports in any desired order and which are not permitted to show any transmission (reflection standards), and by successive measurement of reflection and transmission parameters at k=sum(n−i) for (i=1, 2, ..., n−1) different two-port calibration standards, which are connected between the measurement ports in any desired order and must all exhibit a transmission path (transmission standards), and by computational determination of error coefficients of the network analyzer with 10-term method in k-fold application by using the measured two-port calibration standards as well as by computational determination of error-corrected scattering matrices $[S_x]$ of the n-port calibration standards from the error coefficients of each two-port calibration standard, taking into consideration transmission error variables of remaining n−2 measurement ports with the 10-term multiport method, wherein
   a) one of the n-port calibration standards measurements carried out at an n-fold one-port (n-one-port), which is realized by n known impedances,
   b) one of the n-port calibration standards measurements is a reflection standard Short carried out at an n-one-port, which is realized by n unknown, highly reflecting terminations (R=Reflect), whose electronic properties are similar to those of ideal short circuits (S=Short), c) one of the n-port calibration standards measurements is a reflection standard Open carried out at an n-one-port, which is realized by means of n unknown, highly reflecting terminations (R=Reflect), whose electronic properties are similar to those of ideal open circuits (O=Open), d) the reflection standards Short and Open are realized so as to be physically identical at each port, e) reflection values of the n-one-ports for reflection standards Short and Open, are determined computationally, f) one of the two-port calibration standards measurements is carried out at a two-port, which is realized by a short adapted line (L=line) of known length and attenuation, g) remaining k−1 two-port calibration standards measurements are carried out at k−1 two-ports, which are realized by thru connections, whose length, attenuation and impedances are unknown and are identical for an incident and reflected wave (U=unknown, reciprocal thru connection), and h) transmission values of the two-ports, which are realized by unknown reciprocal thru connections, are determined computationally.

2. Calibration method, as claimed in claim 1, wherein, in step f), i calibration measurements of known length and attenuation are carried out, where 1<i<k, and the remaining k−i calibration measurements with a transmission path are carried out at k−i two-ports, which are realized by an unknown, reciprocal thru connection.

3. Method for calibrating a network analyzer, as claimed in claim 1, wherein step a) is carried out at a one-port, and is realized by a known impedance, and properties of impedances at remaining n−1 one-ports are determined computationally from a calibration measurement of the known impedance at the one-port.

4. Method for calibrating a network analyzer, as claimed in claim 1, wherein step a) is carried out, at an (n−i)-one-port, where i<n, which is realized by a known impedance or a plurality of known impedances, and properties of the known impedances at remaining i one-ports are determined computationally from a calibration measurement of the known impedances at the (n−i) one-ports.

5. Method for calibrating a network analyzer, as claimed in claim 1, wherein electronic properties of one of the highly reflecting terminations are known.

6. Method for calibrating a network analyzer, as claimed in claim 1, wherein at least two of the unknown, reciprocal thru connections are symmetrical to each other for n>3.

7. Method for calibrating a vectorial network analyzer, which exhibits n measurement ports (n>2) and at least m measurement sites, where m>n+1, by measurement of three different n-port calibration standards, which are connected between the measurement ports in any desired order and which are not permitted to show any transmission, and by successive measurement of reflection and transmission parameters at n−1 different two-port calibration standards, which are connected between the measurement ports in any desired order and must all exhibit a transmission path, and by computational determination of error coefficients of the network analyzer with 7-term method in n−1-fold application by using the measured two-port calibration standards as well as by computational determination of error-corrected scattering matrices $[S_x]$ of the n-port calibration standards from the error coefficients of each two-port calibration standard, taking into consideration transmission error variables of the remaining n−2 measurement ports with the 7-term multiport method, wherein a) one of the n-port calibration standards measurements is carried out at an n-one-port, which is realized by n known impedances, b) one of the n-port calibration standards measurements is a reflection standard Short carried out at an n-one-port, which is realized by n unknown, highly reflecting terminations (R=Reflect), whose electronic properties are similar to those of ideal short circuits (S=Short), c) one of the n-port calibration standards measurements is a reflection standard Open carried out at an n-one-port, which is realized by n unknown, highly reflecting terminations (R=Reflect), whose electronic properties are similar to those of ideal open circuits (O=Open), and d) the reflection standards, Short and Open are realized so as to be physically identical at each port, e) reflection values of the n-one-ports for reflection standards Short and Open are determined computationally, f) one of the two-port calibration standards measurements is carried out at a two-port, which is realized between a measurement port, which is established as a reference measurement port, and one of the n−1 remaining ports by a short adapted line (L=line) of known length and attenuation, g) remaining n−2 two-port calibration standards measurements are carried out at n−2 two-ports, which are realized by an unknown, reciprocal thru connection, and h) transmission values of the two-ports, which are realized by an unknown reciprocal thru connection, are determined computationally.

8. Calibration method, as claimed in claim 7, wherein, in step f), i calibration measurements with a transmission path of known length are carried out, where 1<i<n−1, and the remaining n−1−i calibration measurements are carried out at n−1−i two-ports, which are realized by an unknown, reciprocal thru connection.

* * * * *